United States Patent
Williams et al.

(10) Patent No.: US 6,277,695 B1
(45) Date of Patent: Aug. 21, 2001

(54) METHOD OF FORMING VERTICAL PLANAR DMOSFET WITH SELF-ALIGNED CONTACT

(75) Inventors: Richard K. Williams, Cupertino; Sung-Shan Tai, San Jose; Dorman C. Pitzer, San Ramon; Wayne B. Grabowski, Los Altos; Anthony Tsui, Saratoga; Mike F. Chang, Cupertino, all of CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 09/293,380

(22) Filed: Apr. 16, 1999

(51) Int. Cl.[7] .................................................. H01L 21/336
(52) U.S. Cl. ................................... 438/268; 257/341
(58) Field of Search ................................... 438/268, 138, 438/156, 276, 291, 273, 303, 305, 306, 527, 530, 532; 257/341

(56) References Cited

U.S. PATENT DOCUMENTS

| | | | |
|---|---|---|---|
| 5,119,159 | * | 6/1992 | Hoshi .................................... 357/43 |
| 5,476,803 | | 12/1995 | Liu ........................................ 437/44 |
| 5,930,630 | * | 7/1999 | Hshieh et al. ....................... 438/268 |

* cited by examiner

Primary Examiner—David Nelms
Assistant Examiner—Quoc Hoang
(74) Attorney, Agent, or Firm—Skjerven Morrill MacPherson LLP; David E. Steuber

(57) ABSTRACT

The metal contact to the source and body regions in a vertical planar DMOSFET is formed by fabricating a sidewall spacer on the gate of the MOSFET. With the metal contact self-aligned to the gate in this way, the lateral dimension of each of the cells in the DMOSFET can be significantly reduced without the risk of a short between the contact and the gate, and the packing density of the cells can be increased. In this way, significant reductions in the on-resistance of the device can be achieved.

15 Claims, 11 Drawing Sheets

METHOD OF FORMING VERTICAL PLANAR DMOSFET WITH SELF-ALIGNED CONTACT

BACKGROUND

Power MOSFETs typically consist of a pattern of MOSFET cells that are arrayed on the surface of a semiconductor chip. Each cell includes a source region and a body region having opposite conductivity types. At the boundary of the cells a gate overlies the semiconductor material and controls the flow of current through a channel that is formed in the body regions at the surface of the semiconductor material. The gate is electrically isolated from the semiconductor by an insulating layer, typically an oxide. The source and body regions are often formed in a relatively lightly doped epitaxial layer that is formed on top of a more heavily doped substrate. When the MOSFET is turned on, current flows in a path which extends from the source region and through the channel and the epitaxial layer to the substrate, which functions as the drain. Depending on whether the device is an N-channel or P-channel MOSFET, the current (as defined by convention as the flow of positive charges) either flows from the source to the drain (P-channel) or from the drain to the source (N-channel). Actually electrons flow from the negative potential to the more positive potential in N-channel devices. The source and drain are normally contacted by metal layers on opposite surfaces of the chip, although in quasi-vertical devices the drain contact is on the same side of the device as the source contact, and a sinker region having the same conductivity type as the drain extends from the surface to the drain. In most devices, the metal layer which contacts the source also makes contact with the body region. Shorting the source to the body prevents the parasitic bipolar transistor formed by the source (emitter), body (base), and drain (collector) from tuning on.

A cross-sectional view of a typical vertical planar DMOSFET (i.e., double-diffused MOSFET) is shown in FIG. 1. DMOSFET 10 contains a source region 100, a body region 102, a drain region 104, and a gate 106. Source region 100 and body region 102 are formed in an epitaxial (epi) layer 108 which overlies a substrate 110. A metal layer 112 contacts source region 100 and body region 102, a heavily doped body contact region 114 facilitating contact with the body region 102. A metal layer 116 contacts the drain region 104. The gate 106 is separated from the surface of the epi layer 108 by a gate oxide layer 117. Channel regions 118 are located in the body region 102 near the surface of the epi layer 108.

The pattern is repeated in epi layer 108, and FIG. 1 shows a portion of a neighboring source region 100A, body region 102A and channel region 118A. A single section of the gate 106 controls the flow of current (denoted by the arrows) through both of the channel regions 118 and 118A. The currents from channel regions 118 and 118A come together in a region of the epi layer 108 between the body regions 102 and 102A that is sometimes referred to as the "JFET" region, denoted by numeral 124 in FIG. 1.

Together the sections of gate 106 form a grid or stripe pattern, with the gate sections connected as a single electrode.

While MOSFET 10 is shown as an N-channel device, a similar P-channel device has the same structure with the polarities of the various regions reversed (P for N, N for P).

A single "cell" of MOSFET 10 can be defined as having a width W that extends between a line 120 at the center of one section of gate 106 to a line 122 at the center of a another section of gate 106 on the opposite side of the source region 100 and body region 102. The cell can have various shapes and can be either in the form of a closed polygon (e.g., a square or hexagon) or a longitudinal strip.

Generally speaking, the current-carrying capacity of the MOSFET can be increased (and the on-resistance reduced) by packing more cells into a unit area of the surface of the device. This increases the total perimeter of the cells and the total channel "width" through which the current may flow. The packing density of the cells is a function of the cell width W.

There are limitations, however, on reducing W. The width of the JFET region 124 (shown as $d_1$) can be reduced only to certain point without increasing current-crowding in the JFET region 124 and increasing the on-resistance of the device. The length of the channel, shown as $d_2$ cannot be reduced without risking punchthrough breakdown (an undesirable condition where the channel becomes totally depleted and current flows independently of the gate bias).

What remains is the possibility of reducing the distance between the sections of gate 106, shown as $d_3$. The problem is to insure that a separation is maintained between gate 106 and metal layer 112. The gate 106 and the metal layer 112 are normally formed by photolithographic processes which involve masking and etching. FIG. 2, for example, shows a mask opening that is used to form an opening in a BPSG layer 200 for the source/body contact in a MOSFET 20. The distance $d_4$ represents the separation between the gate 206 and the (future) contact.

Photolithographic processes are subject to errors in the lateral sizes and positioning of the elements defined. In these circumstances, the following formula expresses the minimum permissible design spacing between gate 106 and metal layer 112:

$$\text{GateToMetalSpacing}_{min} = \sqrt{\Delta CD_{gate}^2 + \Delta CD_{contact}^2 + MA_{---}^2}$$

where $\Delta CD_{gate}$ is the is the variation in the critical dimension of the gate 106, $\Delta CD_{contact}$ is the variation in the critical dimension of the contact (metal layer 112), and $MA_{gate/contact}$ is the potential misalignment between the gate and contact. If this separation is not maintained, there is an unacceptable risk that the gate will be shorted to the metal contact, and the MOSFET will permanently disabled. In a low cost production process a projection aligner or 1X stepper would be used and the variations in the critical dimension and potential misalignment would be relatively large. These values can be reduced by using, for example, a 5X reduction stepper, but this increases the cost significantly. The distance $d_3$ is typically from $0.5\mu$ to $1.0\mu$, and only with very expensive equipment can $d_3$ be reduced much below $0.5\mu$.

U.S. Pat. No. 5,476,803 to Lui teaches the use of a spacer oxide on the side walls of the gate region in a lateral MOSFET. However, although Lui notes that the spacer oxide may be used to reduce the overall size of the semiconductor device, Lui is primarily concerned with problems specific to lateral devices, i.e., altering the doping diffusions of the drain to reduce the parasitic capacitance and resistance of the lateral device. Moreover, Lui teaches that the width of the spacer oxide regions would be "somewhat diminished, and thus would not prevent the transistor . . . from shorting" unless a "pad oxide layer" of "substantial thickness" remains on the top of the gate electrode.

Thus there is a clear need for an economical way of reducing the MOSFET cell dimension in a vertical planar device, and particularly the distance between the gate segments.

SUMMARY

According to the method of this invention, the lateral dimension between the gate sections in a vertical planar DMOSFET is reduced by self-aligning the gate with the contact to the source region. This avoids the need to be concerned about possible shorting between the gate and the contact which is inherent in a technology wherein the gate and the hole in which the contact is located are defined in successive masking steps as described above.

The first part of the process includes the formation of a the source and body regions in a vertical planar DMOSFET. Conventionally, this process begins with a semiconductor body which in many cases will comprise an epitaxial layer of a first conductivity type grown on a surface of a semiconductor substrate of the same conductivity type. A gate oxide layer is formed on a surface of the semiconductor body, and a conductive gate layer is formed on the gate oxide layer. A portion of the conductive gate layer is removed to define the gate, which is typically an interlinked lattice of sections connecting an array of MOSFET cells. A first dopant of a second conductivity type is implanted into the semiconductor body to form a body region, the body region forming first PN junction with a portion of the semiconductor body that is doped to a first conductivity type. After the implant the first PN junction is aligned with an edge of the gate. The semiconductor body is then heated to diffuse the first dopant such that the first PN junction extends beneath the gate. A second dopant of the first conductivity type is implanted into the epitaxial layer to form a source region, which has a second PN junction with the body region. A region between the first and second PN junctions beneath the gate forms a channel region.

Importantly, an oxide layer is then formed overlying the gate and a first portion of the source region. The oxide layer is anisotropically etched so as expose a portion of said source region while leaving a spacer portion of said oxide layer on a sidewall of said gate, thereby forming a contact opening. The contact opening is thus self-aligned with the gate. The contact opening is then filled with a conductive material, typically a metal, so as to form an electrical contact to the source region.

There are numerous variations of this process. Frequently the gate will consist of doped polycrystalline silicon (polysilicon), and a layer of polysilicon oxide will be formed on top of the gate before the oxide layer is formed. The semiconductor body is often masked before the source implant to prevent the source dopant from reaching a portion of the semiconductor body, allowing a portion of the body region to remain at the surface of the semiconductor body. The anisotropic etching of the oxide layer exposes at least a portion of the body region so that the contact opening provides for a source/body contact.

What is described is thus a relatively simple means of reducing the lateral dimension between the gate sections and thereby increasing the density packing of cells in a vertical planar DMOSFET. This holds the potential for significantly reducing the on-resistance of the DMOSFET without the added cost of using expensive steppers and other equipment.

BRIEF DESCRIPTION OF THE DRAWINGS

This invention will be better understood by reference to the following description and drawings, in which.

DESCRIPTION OF THE INVENTION

The first part of a process according to this invention entails the formation of the source and body regions in a vertical planar DMOSFET. While the process is subject to some variations, in general a gate is defined and then used as a mask for the implantation of the source and body regions. In this way the gate is self-aligned to the source and body regions. The channel region is formed by a difference in the extent of the diffusion of the source and body regions laterally under the gate.

FIGS. 3A through 3J illustrate the initial portion of this process. While the process is described in the context of an N-channel MOSFET, it can also be performed for a P-channel MOSFET by reversing the polarities of the materials and implants.

Figure 1:
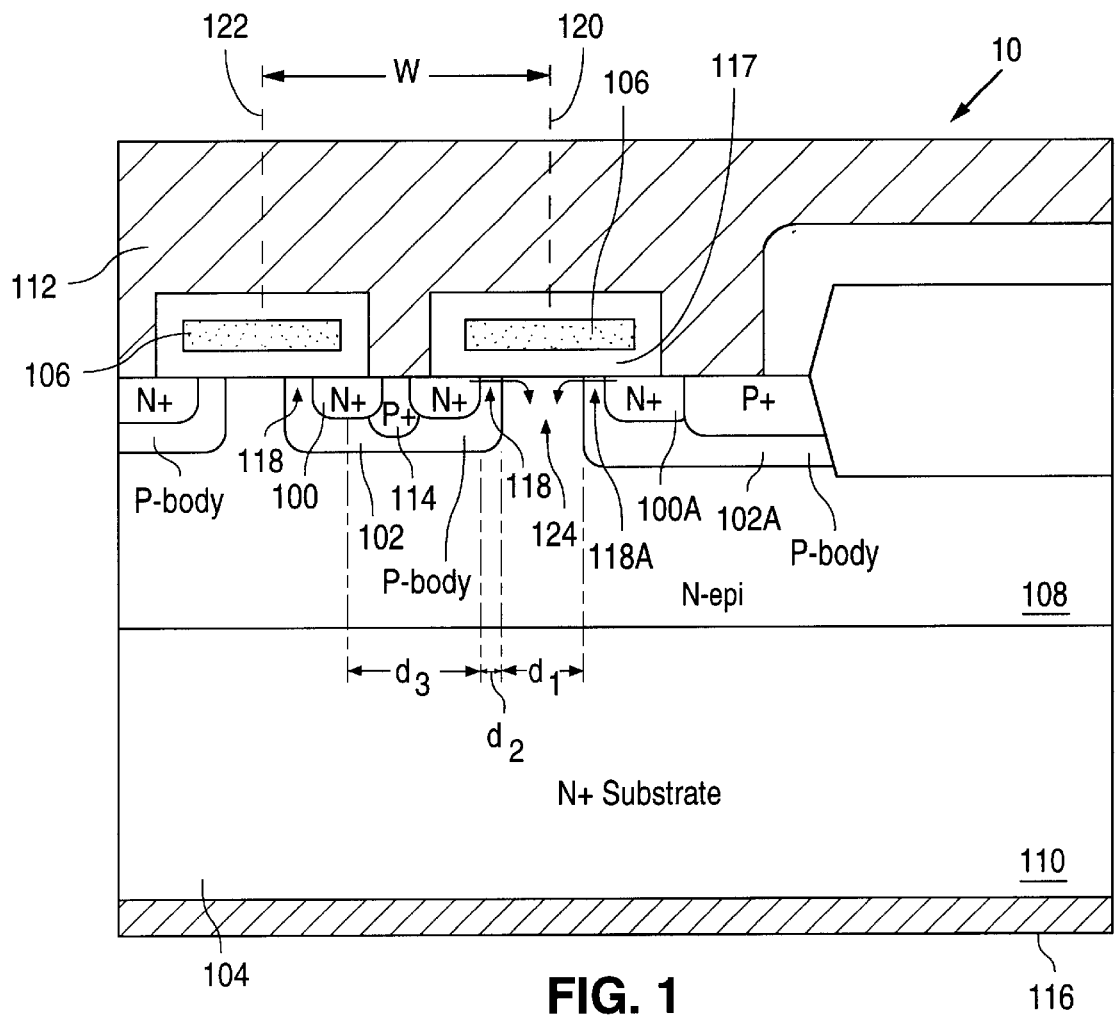
FIG. 1 shows a cross-sectional view of a conventional vertical planar DMOSFET.
Figure 2:
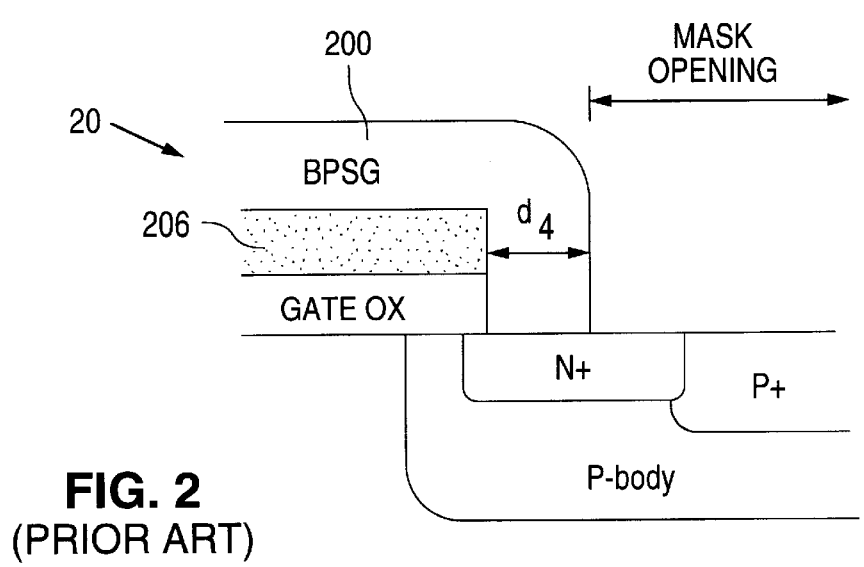
FIG. 2 shows a detailed cross-sectional view of the region between the gate and the source contact in a conventional vertical planar DMOSFET.
Figure 3A:
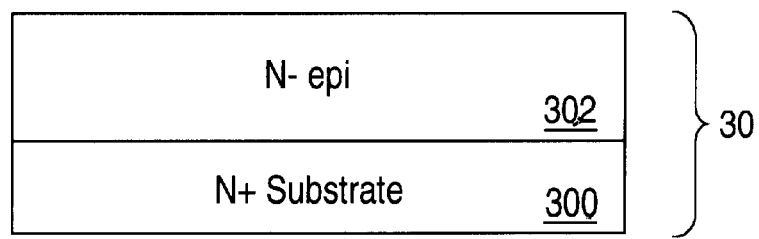
FIGS. 3A–3N show a process sequence for fabricating a vertical planar DMOSFET having a self-aligned contact in accordance with this invention.

As shown in FIG. 3A, the process begins with an N+ substrate 300 on which an N-type epitaxial (epi) layer 302 is grown. For a 6-inch wafer substrate 300 might be on the order of 18–20 mils thick, and it could be thicker for an 8- or 12-inch wafer. Substrate 300 is heavily doped with phosphorus or arsenic, preferably to a resistivity of less than 5 mΩ-cm and ideally about 3 mΩ-cm. N-epi layer 302 is generally doped with N-type impurity to a concentration of from $8\times10^{15}/cm^3$ to $1\times10^{17}/cm^3$, depending on the breakdown voltage of the MOSFET, which could be from 8V to 60V, with 12V, 20V and 30V being common breakdown voltages. Together N+ substrate 300 and N-epi layer 302 form a semiconductor body 30.

Figure 3B:
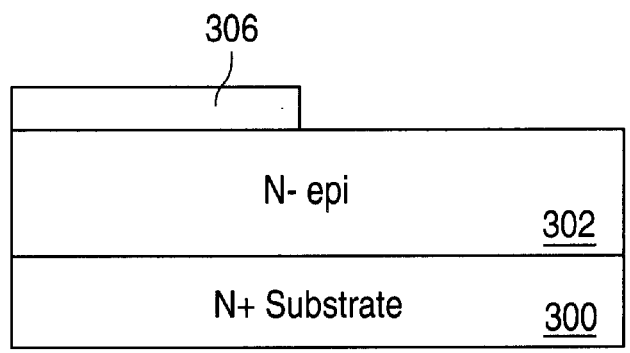
Figure 3C:
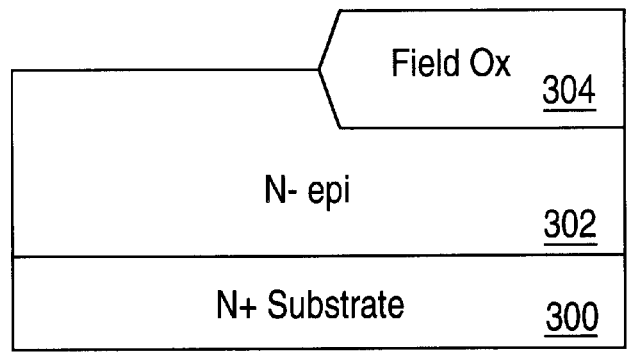

As shown in FIGS. 3B and 3C, a field oxide region 304 is grown in N-epi layer 302 in a region which will form the termination area of the MOSFET. Using the well-known LOCOS (local oxidation of silicon) process, a nitride layer 306 is formed in the area where field oxide region 304 is not to be located, and semiconductor body 30 is heated in oxygen or steam at a temperature of from 900 to 1150° C. for from 30 minutes to 3–4 hours. This is done in accordance with well-known oxidation curves that are available in numerous textbooks. Nitride layer 306, which prevents oxidation from occurring where the MOSFET is to be located, is then stripped. Field oxide region 304 is generally from 2000 Å to 1.5µ thick, 5000 Å being typical. Alternatively, field oxide region 304 could be thermally grown over the entire surface of N-epi layer 302 and etched back in the region where the MOSFET is to located, using a photomask to protect field oxide region 304 from etchback in areas other than the active region. With the etch process the edges of the field oxide region are less sloped than with the LOCOS process.

Figure 3D:
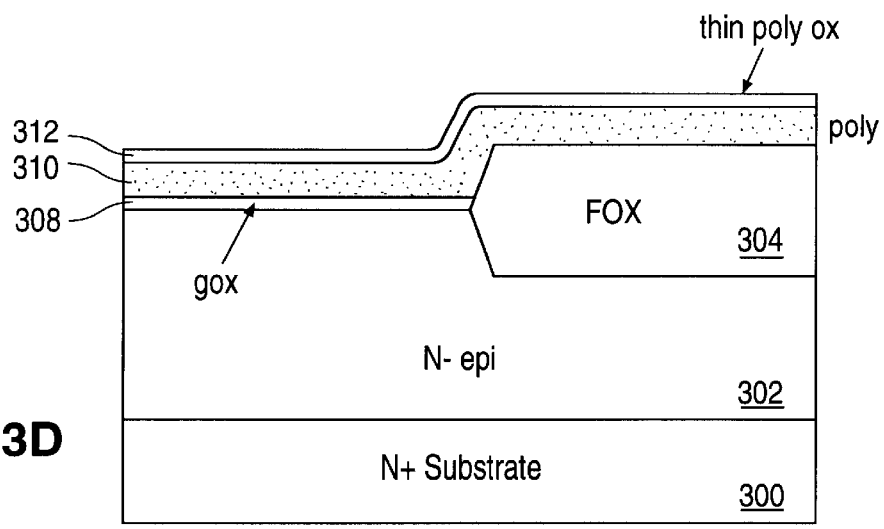

As shown in FIG. 3D, a gate oxide layer 308 is then grown on the exposed surface of N-epi layer 302. Gate oxide layer 308 is normally from 90 Å to 1200 Å thick, with 500 Å, 300 Å, 175 Å and 120 Å being common gate oxide thicknesses for devices having gate voltage ratings of 20V, 12V, 7–8V and 5V, respectively. Gate oxide layer 308 can be grown in dry oxygen, often in the presence of a chlorine source such as TCA or hydrochloric acid to provide an ionic barrier, at 900 to 1150° C. (typically 1000 to 1050° C.) for 20 minutes to 3–4 hours.

A polysilicon layer 310 is then deposited on gate oxide layer 308 using a chemical vapor deposition process, or alternatively polysilicon layer 310 can be deposited as amorphous silicon and recrystallized. Usually polysilicon layer 310 is in the range of 2000 Å to 5000 Å thick. Optionally, a thin polysilicon oxide layer 312 is grown or deposited on the top surface of polysilicon layer 310. Thin polysilicon oxide layer 312 can be grown by heating at 900 to 1050° C. for 15 to 30 minutes. Thin polysilicon oxide layer 312 is several hundred Angstroms thick and seals polysilicon layer 310 to protect it from contamination from the reactor during subsequent implants.

Figure 3E:
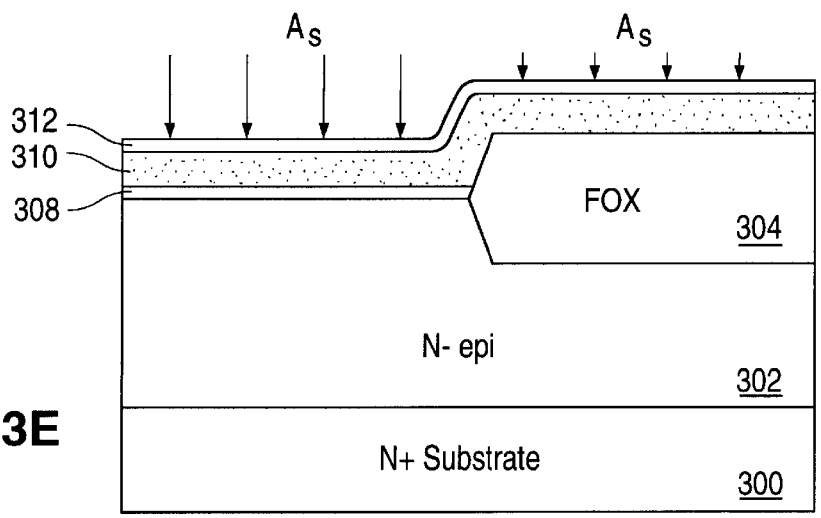

As shown in FIG. 3E, an N-type dopant such as As or P is implanted into polysilicon layer 310 if the MOSFET is to be an N-channel device. This implant can be carried out at a dose of $1\times10^{15}/cm^2$ to $1\times10^{16}/cm^2$ at 30 keV to 80 keV, with 60 keV being common. Alternatively, the polysilicon can be doped using $POCl_3$ deposition at from 800° C. to 1100° C. If the MOSFET is to be a P-channel device, a boron implant or boron nitride predeposition can be carried out at 800 to 1100° C.

Figure 3F:
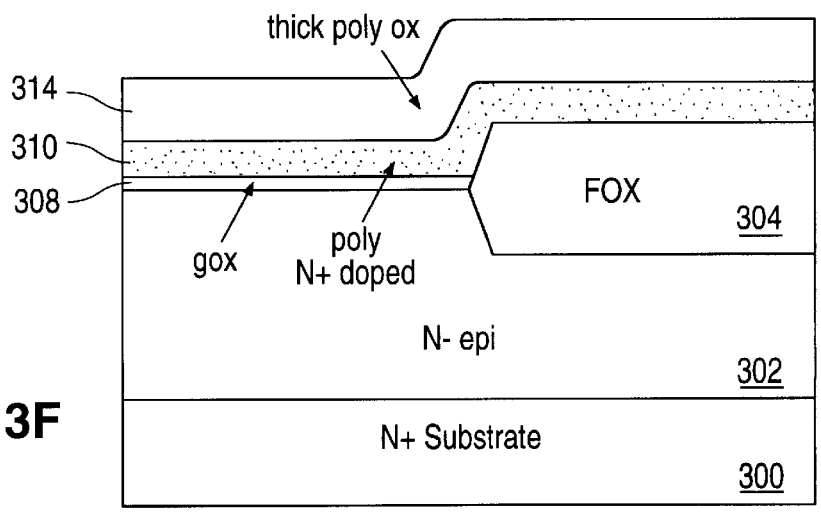

As shown in FIG. 3F, thin polysilicon oxide layer 312 is stripped, and an optional thick polysilicon oxide layer 314 is deposited on polysilicon layer 310 to a thickness of from 1000 Å to 5000 Å. A layer of doped borophosphosilicate glass (BPSG) (not shown) can be deposited on the thick polysilicon oxide layer 314. Alternatively, a BPSG layer can be deposited in lieu of thick polysilicon oxide layer 314.

Figure 3G:
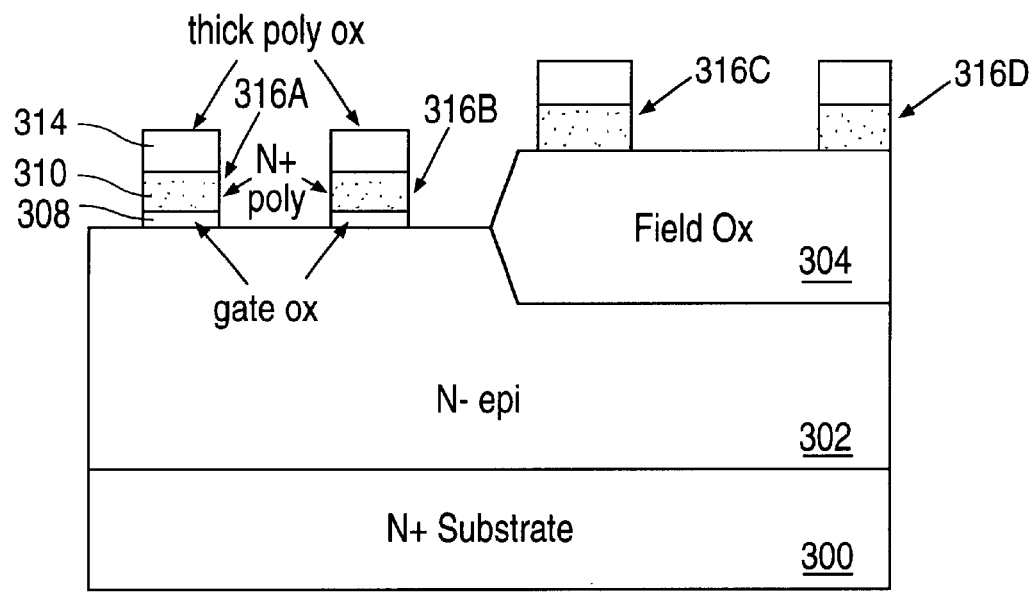

As shown in FIG. 3G, the structure is masked with a photoresist layer (not shown) to define the gate, and thick polysilicon oxide layer 314, polysilicon layer 310 and gate oxide layer 308 are etched using an anisotropic etching technique such as reactive ion etch (RIE) or plasma etch to provide gate sections 316A and 316B having straight vertical sidewalls. The photoresist mask is patterned such that portions of polysilicon layer 310 consisting of a source plate 316C and a drain plate 316D remain on top of field oxide region 304, which will be the termination region of the device. The photoresist mask is then stripped.

Figure 3H:
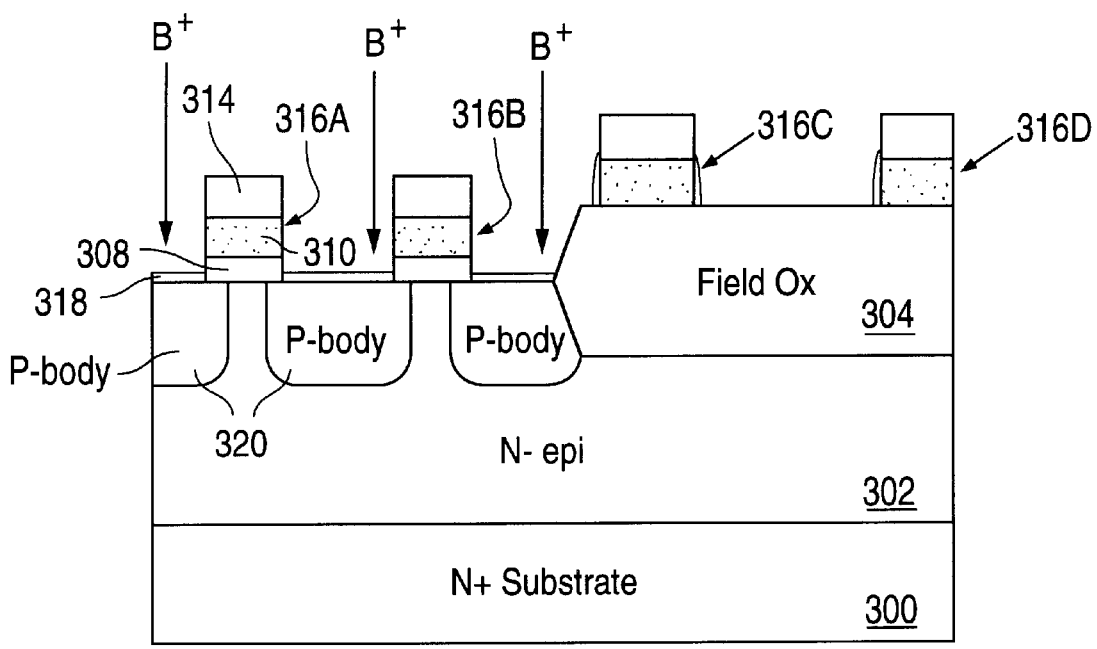

As shown in FIG. 3H, a thin oxide layer 318 is formed on the surface of N-epi layer 302, and P-body regions 320 are formed by implanting boron at a dose of $5\times10^{13}/cm^2$ to $1\times10^{14}/cm^2$ at 60 keV to 300 keV, typically about 80 keV. The boron does not penetrate the thick polysilicon oxide layer 314 significantly, and to the extent that it does it has no significant effect on the concentration level of dopant in gate sections 316A and 316B because gate sections 316A and 316B are heavily doped with N-type dopant. In the case of a P-channel device, the body implant should be N-type comprising phosphorus implanted at similar energies and doses.

P-body regions 320 are driven in at 1000° to 1200° C. (typically 1100° to 1150° C.) for from 30 minutes to 6–7 hours, depending on the depth of the P-body regions desired. Typical depths for the P-body regions are from $1\mu$ to $3\mu$. As indicated in FIG. 3H, after P-body regions 320 have been driven in, they extend laterally some distance under gate sections 316A and 316B. A similar drive-in diffusion is used for phosphorus in P-channel devices.

Figure 3I:
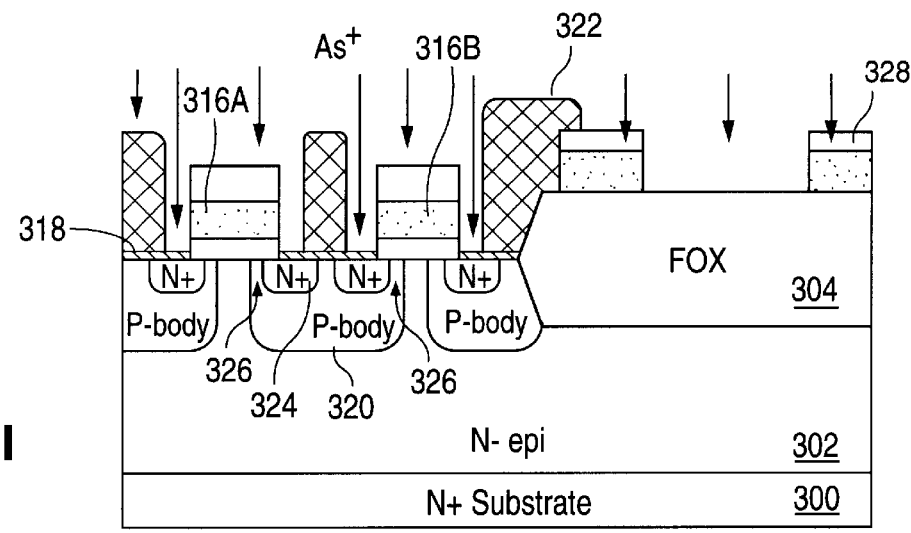

As shown in FIG. 3I, a photoresist layer 322 is applied to define the source regions, and N-type dopant (arsenic or phosphorus) is implanted at a dose of $1\times10^{15}/cm^2$ to $1\times10^{16}/cm^2$ ($5\times10^{15}/cm^2$ to $7\times10^{15}/cm^2$ being preferred) at 40 keV to 120 keV, preferably about 100 keV. The implanted N-type dopant is diffused by heating it at 900° to 1100° C. for from 20 minutes to 1 hour. This drives the N-type dopant in to a depth of from $0.2\mu$ to $0.6\mu$, with $0.4\mu$ being typical. The result is N+ source regions 324. Channel regions 326, having a length of from $0.81\mu$ to $0.9\mu$ are formed under the gate sections 316A and 316B. The N-type dopant penetrates the active areas but does not penetrate the thick polysilicon oxide layer that overlies the gate sections 316A and 316B nor does it penetrate oxide layer 328. Following the implantation but before the diffusion of the N+ source regions 324, photoresist layer 322 is stripped.

Figure 3J:
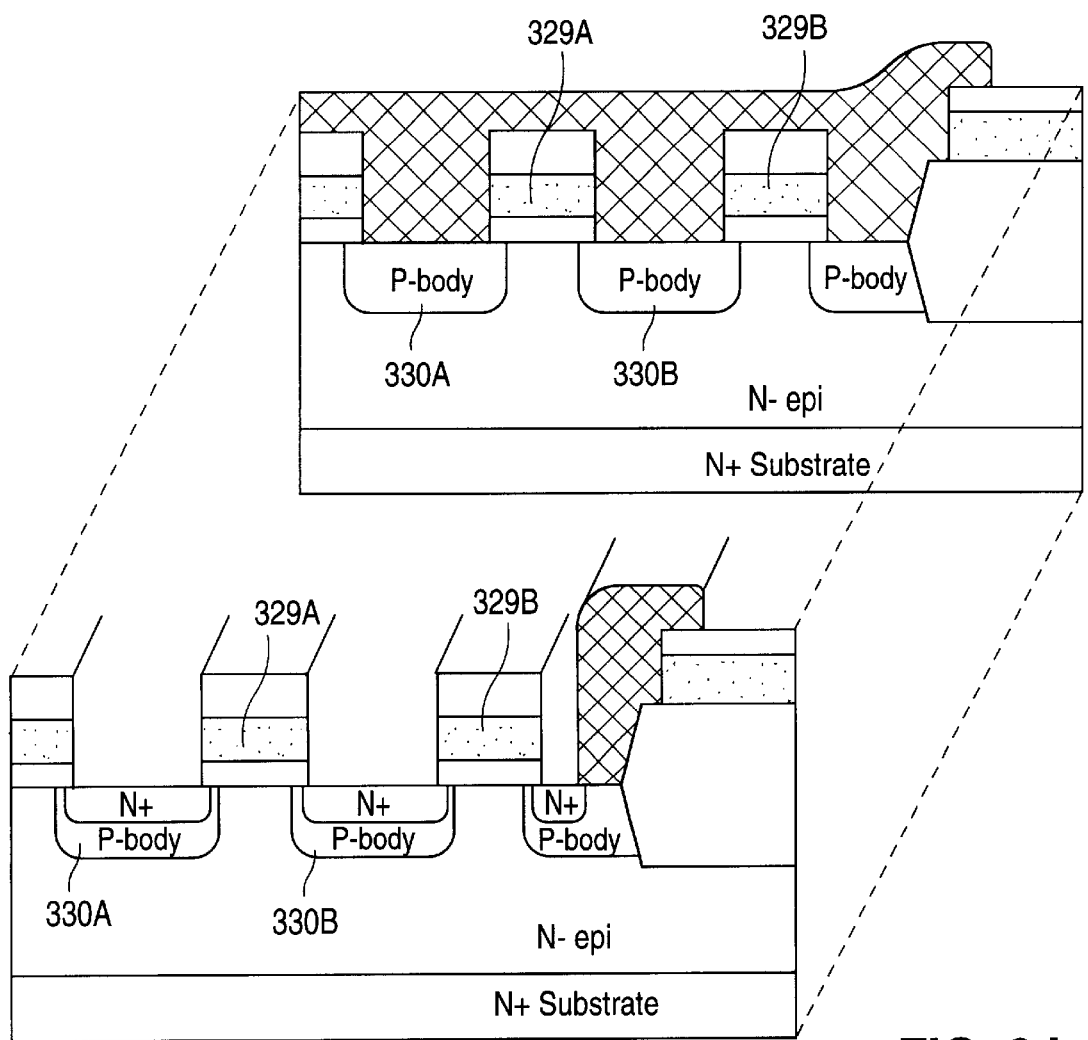

In FIG. 3I, the photoresist layer 322 between the gate sections 316A and 316B ensures that the P-body regions 320 reach the surface of N-epi layer 302 so that the P-body may be contacted by the metal contact. FIG. 3J shows an alternative embodiment wherein gate sections 329A and 329B and P-body regions 330A and 330B are in the form of longitudinal stripes and wherein photoresist layer 332 is not deposited on the P-body regions 330A and 330B. In this embodiment the P-body regions are not contacted within the individual MOSFET cells, and the P-body contact is made somewhere else on the chip.

Figure 3K:
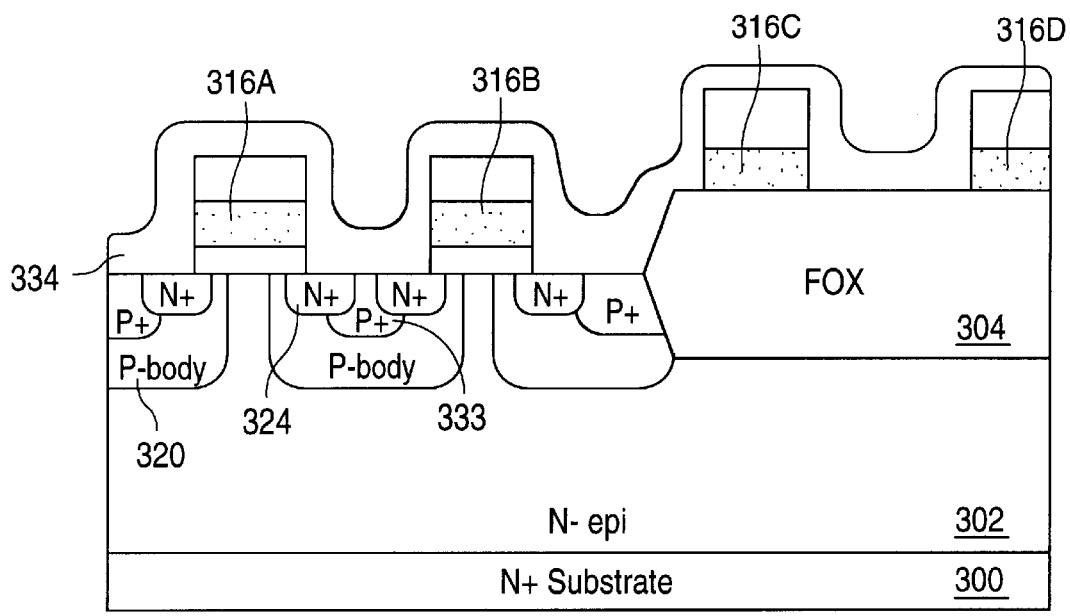

Assuming that there is to be a P-body contact in each cell, a blanket implant of a P-type dopant such as boron is then performed to form P+ body-contact regions 333, as shown in FIG. 3K. This body-contact implant is carried out at a dose of from $5\times10^{14}/cm^2$ to $2\times10^{15}/cm^2$ and at 25 keV to 90 keV. Since the dose of this body-contact implant is only one-third to one-half of the dose of the N-type implant used to form N+source regions 324, the P-body contact implant does not significantly affect the net concentration of dopant in N+ source regions 324.

In a conventional process the next step would normally be to deposit a layer of an insulating material such as BPSG glass, reflow it, mask it, and then etch it to form an opening for the source contact. This presents the risks of misalignment discussed above, and to insure that the contact is not shorted to the gate the dimension $d_3$ must be maintained at or above a specified level, thereby limiting the cell packing density.

In contrast, according to this invention a spacer layer 334, shown in FIG. 3K, is deposited on the top surface of the chip. Spacer layer 334 will normally be from 2000 Å to $1.0\mu$ thick, and often in the range of 4000–5000 Å thick. Spacer layer 334 preferably consists of silicon dioxide ($SiO_2$), but it may be formed of a variety of other materials such as spin-on-glass and BPSG. Spin-on-glass is applied in a spin-on process similar to the process used to apply photoresist, while BPSG is typically deposited using a higher temperature chemical vapor deposition process.

Figure 3L:
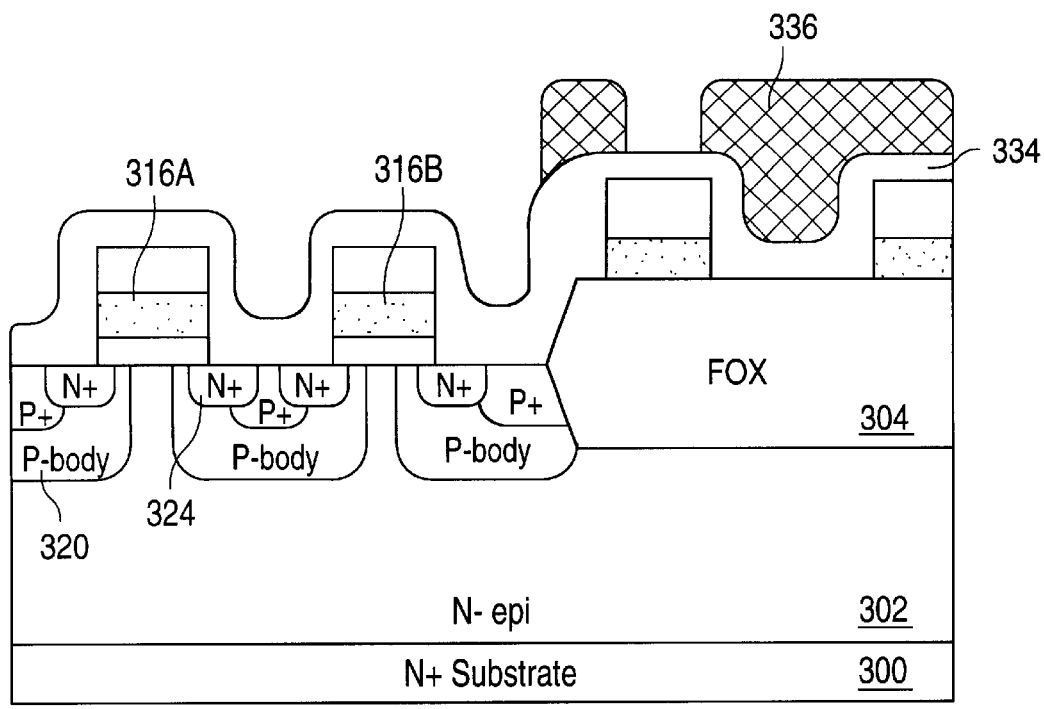
Figure 3M:
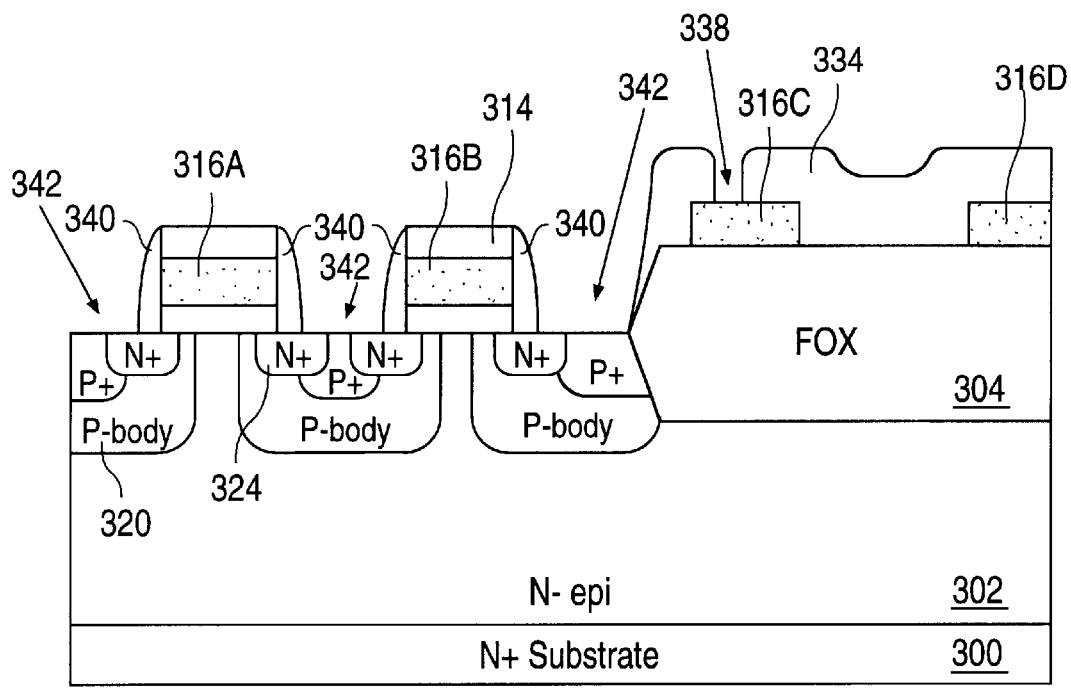

As shown in FIG. 3L, a photoresist layer 336 is deposited on spacer layer 334 over the edges of the source plate 316C and over the entire drain plate 316D but not over the region of the MOSFET as is required in the conventional process. Spacer layer 334 is then etched with a directional, vertical etch, also called an anisotropic etch, which removes all of the spacer layer 334 from the flat surfaces but leaves spacers 340 on the sides of gate sections 316A and 316B (since layer 334 is thicker on the side walls of the gate stack) thus opening contact holes 342 to the MOSFET source and body that are self-aligned to the gate. A contact hole 338 is also opened to the source plate 316C. The resulting structure is shown in FIG. 3M.

Figure 3N:
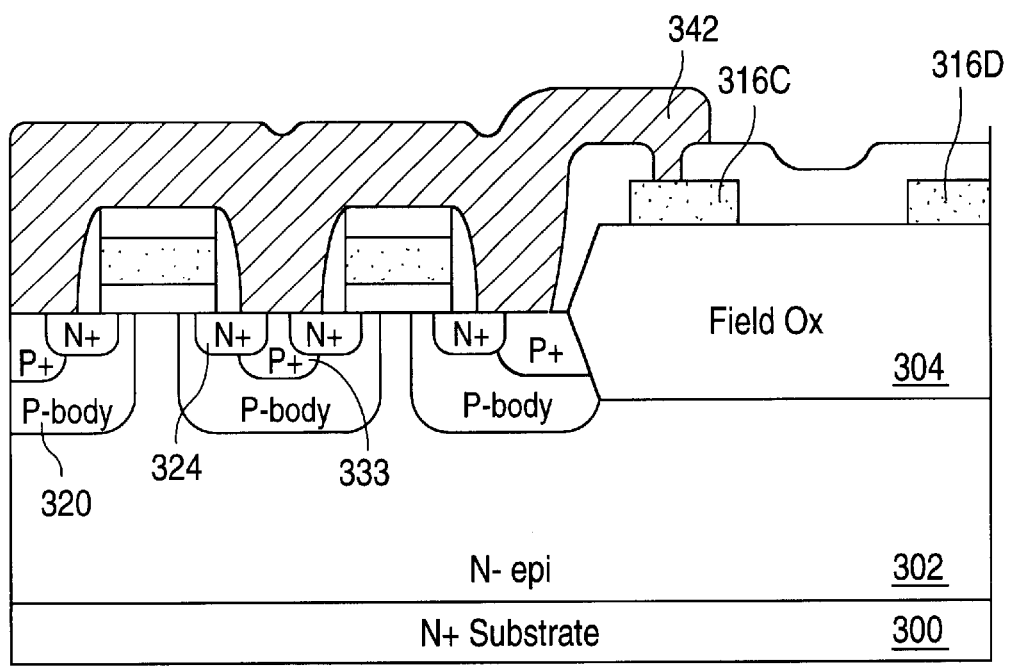

As shown in FIG. 3N, a metal layer 342 is then deposited, masked and etched. Metal layer 342 makes contact with the N+ source regions 324 and the P+ body-contact regions 333, but metal layer 342 is prevented from shorting to the gate sections 316A and 316B by the spacers 340 and the polysilicon oxide layer 314. Metal layer 342 also contacts the source plate 316C, which extends to a source contact pad somewhere on the chip. When the chip is sawed to separate it from other chips in the wafer, the sawing process takes place in the region of drain plate 316D and causes drain plate 316D to be shorted to the N+ substrate 302, which forms the drain of the MOSFET.

Figure 4:
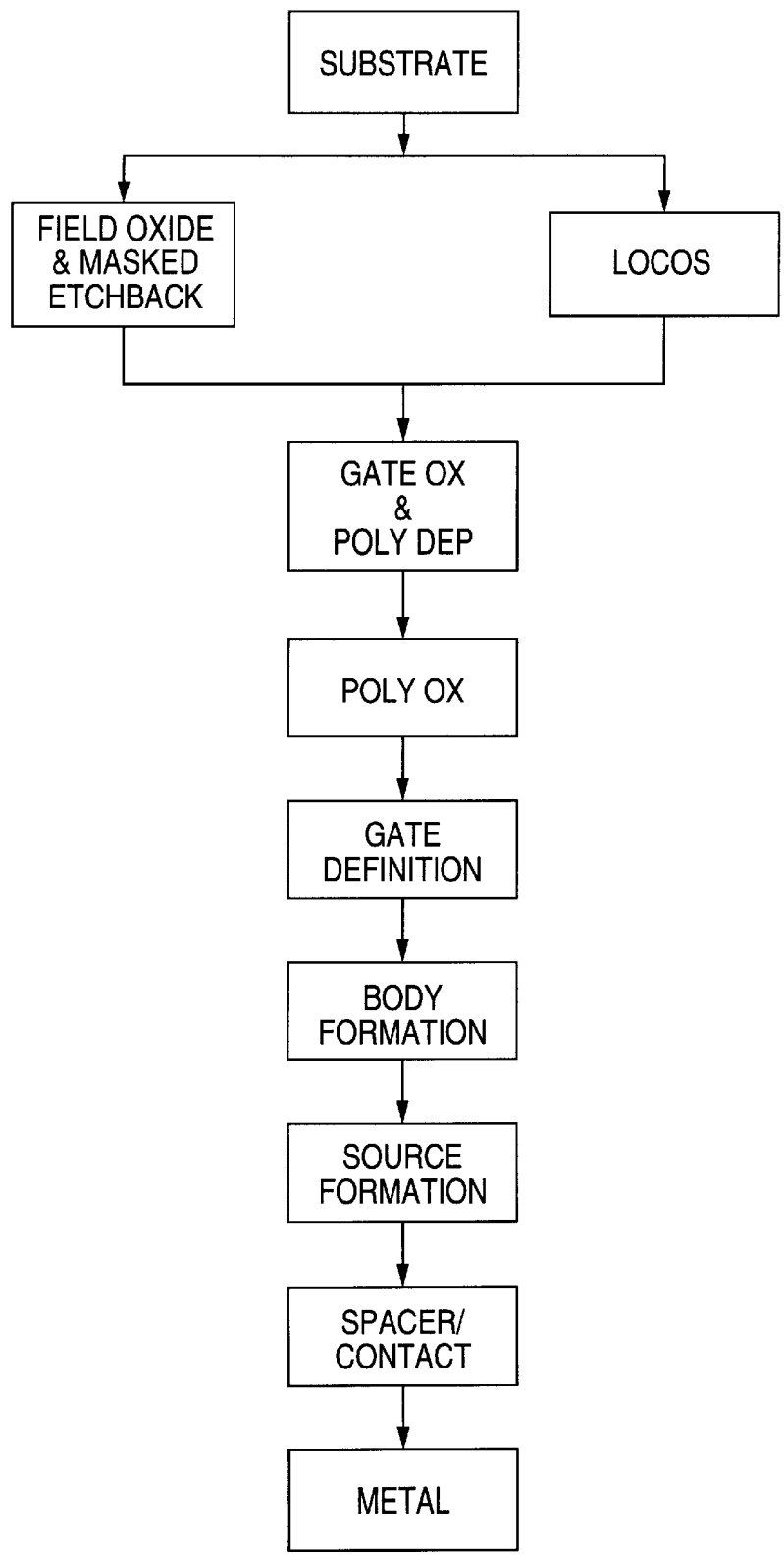
FIG. 4 is a flow chart summarizing the process sequence shown in FIGS. 3A–3N.
Figure 5:
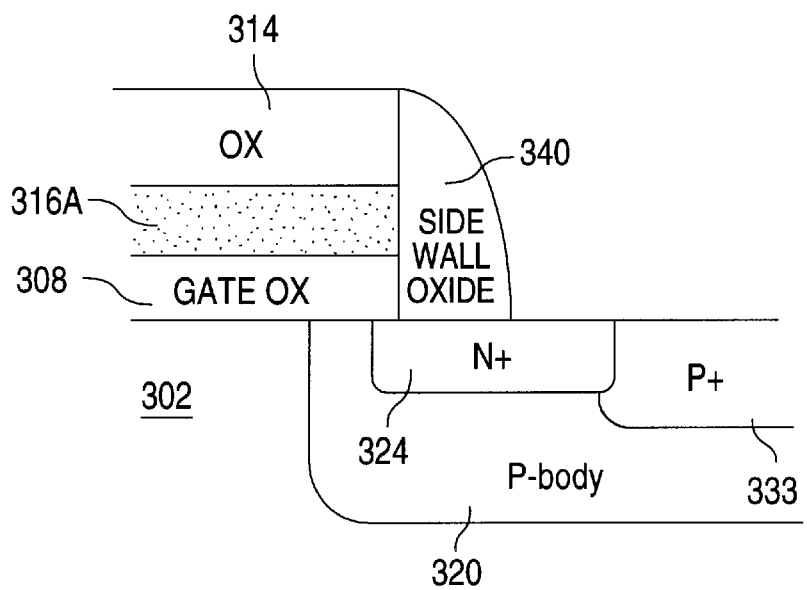
FIG. 5 is a detailed cross-sectional view of a sidewall spacer in accordance with the invention.

FIG. 4 illustrates a flow chart which summarizes the process described above, and FIG. 5 shows a detailed view of sidewall spacer 340.

Figure 6A:
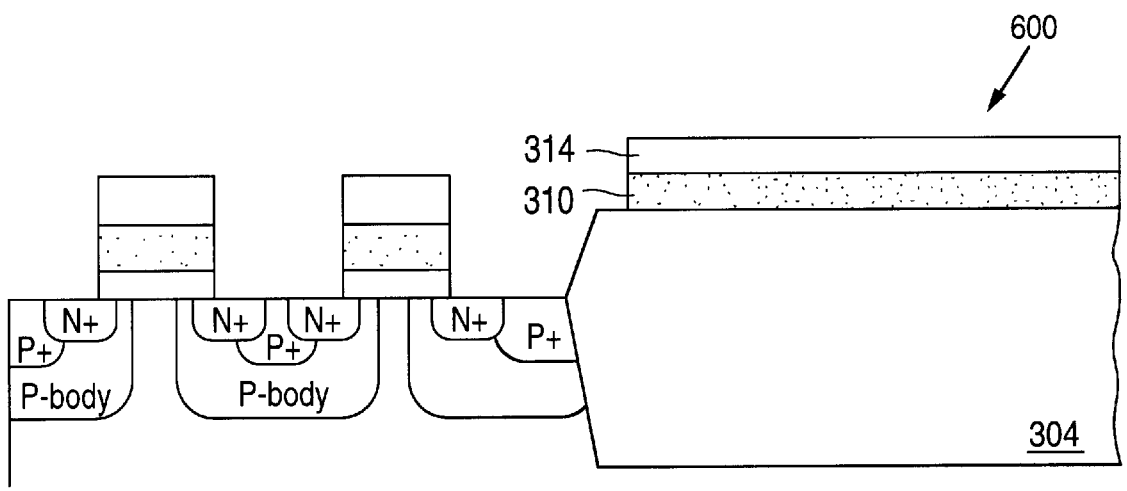
FIGS. 6A–6E show an alternative process sequence for fabricating a vertical planar DMOSFET according to this invention.
Figure 6B:
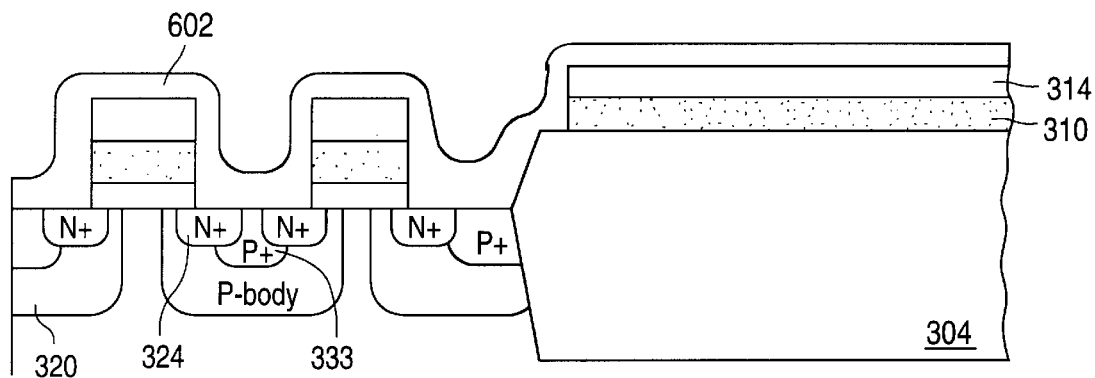

FIGS. 6A–6E show an alternative process for forming the termination region 600. When the gate is defined, as shown in FIG. 3G, polysilicon gate layer 310 and polysilicon oxide layer 314 are left intact over the substantially all of field oxide region 304. After P-body regions 320, N+ source regions 324 and P+ body contact regions 333 have been formed, as shown in FIGS. 3H and 3I, an oxide layer 602 is deposited over the top surface of the device. This is shown in FIG. 6B.

Figure 6C:
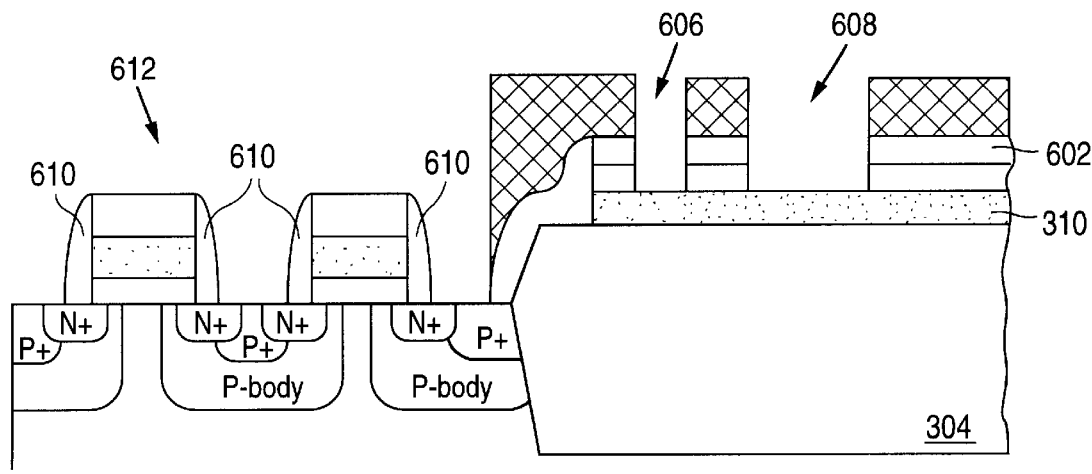

As shown in FIG. 6C, a photoresist layer 604 is deposited on top of oxide layer 602 and is patterned using photolithographic processes. In particular, the active device region 612 where the MOSFETs are to be formed is left uncovered by photoresist layer 604, and two openings are formed in the termination region 600. Oxide layer 602 is then etched using a directional etch such as RIE or a plasma etch. Two openings 606 and 608 are etched in the termination region 600, exposing the top surface of polysilicon layer 310. In the active device region 612, sidewall spacers 610 are formed on the sidewalls of the gate sections, as described above.

Figure 6D:
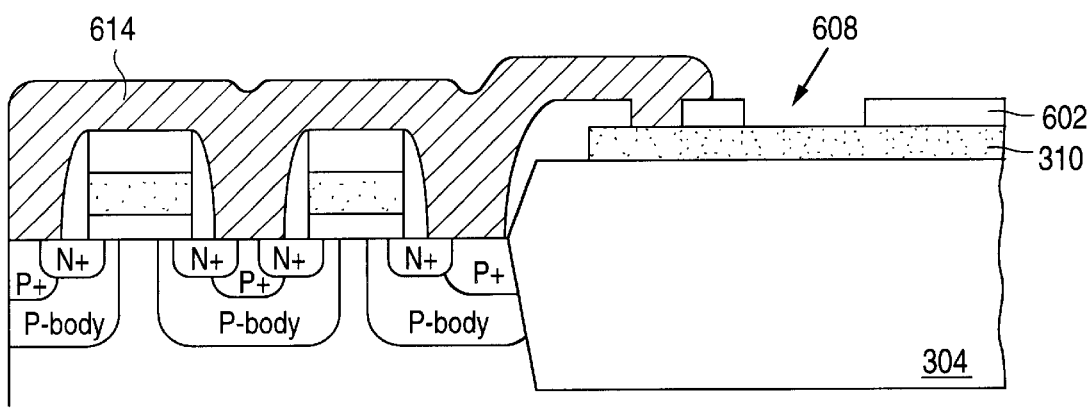
Figure 6E:
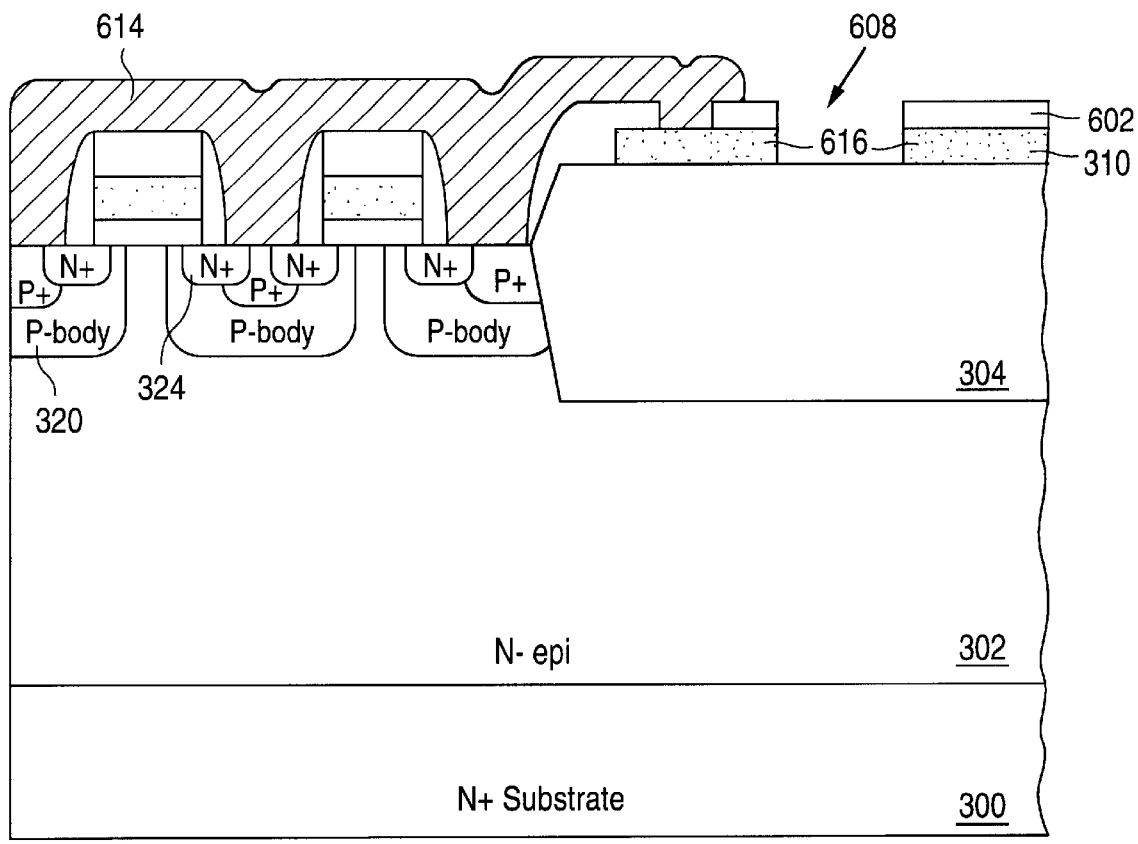

As shown in FIG. 6D, a metal layer 614 is deposited and patterned such that the source-body regions of the MOSFET are contacted, and the polysilicon layer 310 is contacted through hole 606. The surface of polysilicon layer 310 is left exposed in hole 608.

Metal layer 614 is normally an Al—Cu—Si layer. If so, as metal layer 614 is deposited and etched, nodules of silicon will emerge from metal layer 614. To remove these nodules, typically the structure is etched with an etchant (e.g., an HF and nitric acid mixture) that attacks silicon but does not attack the metal. The nitric acid oxidizes the silicon and the HF simultaneously etches the silicon oxide. This etchant also removes the polysilicon layer 310 from hole 608, yielding the structure shown in FIG. 6E. This termination region is similar to that shown in FIG. 3N, except that the side edges 616 of polysilicon layer 310 are left exposed. Thus the process could be finished by the deposition of a glass or silicon nitride passivation layer (not shown), which would require an additional mask.

The process sequences shown in FIGS. 3A–3N and 6A–6E require only one additional mask as compared with the prior art process. Using the process of this invention, the distance between the sections of the gate can be reduced from about 1.8 $\mu$ m down to about 1.1 $\mu$ m. Using a stripe geometry for the MOSFET cells, the cell density can be increased from about 7 million cells per square inch to from 18 to 28 million cells per square inch. This represents a reduction in on-resistance of from 30% to 50%.

The foregoing embodiments are intended to be illustrative and not limiting of the broad principles of this invention. Many additional embodiments will be apparent to persons skilled in the art.

We claim:

1. A method of forming a vertical planar MOSFET comprising:

provide a semiconductor body of a first conductivity type;

forming a gate oxide layer on a surface of the semiconductor body;

forming a conductive gate layer, the conductive gate layer being located at least partially on the gate oxide layer;

removing a portion of the conductive gate layer to form a gate;

implanting a first dopant of a second conductivity type into the semiconductor body to form a first PN junction between the body region and a portion of the semiconductor body doped to the first conductivity type, the first dopant not entering the semiconductor body beneath the gate such that the first PN junction is aligned with an edge of the gate;

heating the semiconductor body to drive in the first dopant, thereby causing the first dopant to diffuse such that the first PN junction extends to a region beneath the gate;

implanting a second dopant of the first conductivity type into the semiconductor body to form a source region, a second PN junction being formed between the source region and the body region, a region between the first and second PN junctions beneath the gate comprising a channel region;

forming an oxide layer, the oxide layer overlying the gate and the source region;

anisotropically etching the oxide layer so as expose a portion of the source region while leaving a spacer portion of the oxide layer on a sidewall of the gate, thereby forming a contact opening; and filling the contact opening with a conductive material so as to form an electrical contact to the source region.

2. The method of claim 1 wherein providing a semiconductor body comprises providing a semiconductor substrate and growing an epitaxial layer on a surface of the substrate.

3. The method of claim 1 wherein forming a conductive gate layer on the gate oxide layer comprises depositing a layer of polysilicon.

4. The method of claim 3 comprising forming a layer of polysilicon oxide on top of the polysilicon layer, implanting a dopant of the first conductivity type into the polysilicon layer through the layer of polysilicon oxide, and removing the layer of polysilicon oxide.

5. The method of claim 1 comprising forming a thick nonconductive layer on top of the conductive gate layer.

6. The method of claim 5 wherein the thick layer comprises a material from the group consisting of polysilicon oxide and borophosphosilicate glass.

7. The method of claim 1 comprising forming a field oxide region at a surface of the semiconductor body.

8. The method of claim 7 wherein forming a conductive gate layer comprises forming a portion of the conductive gate layer over the field oxide region.

9. The method of claim 8 wherein removing a portion of the conductive gate layer comprises removing a portion of the conductive gate layer over the field oxide region to form a plate.

10. The method of claim 9 wherein the plate comprises a source plate.

11. The method of claim 9 wherein the plate comprises a drain plate.

12. The method of claim 9 wherein forming an oxide layer comprises forming an oxide layer extending over the conductive gate layer in the region where the conductive gate layer overlies the field oxide region.

13. The method of claim 12 wherein anisotropically etching the oxide layer comprises etching an opening in the oxide layer to expose a portion of the plate.

14. The method of claim 7 wherein forming a field oxide region comprises forming a nitride layer on the semiconductor body, removing a portion of the nitride layer to expose the semiconductor body where the field oxide region is to be located, and oxidizing the exposed portion of the semiconductor body to form the field oxide region.

15. The method of claim 7 wherein forming a field oxide region comprises forming a thick oxide layer and removing a portion of the thick oxide layer, a remaining portion of the thick oxide layer forming the field oxide region.

* * * * *

UNITED STATES PATENT AND TRADEMARK OFFICE
CERTIFICATE OF CORRECTION

PATENT NO.     : 6,277,695 B1
DATED          : August 21, 2001
INVENTOR(S)    : Richard K. Williams et al.

It is certified that error appears in the above-identified patent and that said Letters Patent is hereby corrected as shown below:

Column 1,
Line 35, delete "tuning" and insert -- turning --;

Column 2,
Line 52, delete "Lui" and insert -- Liu --.

Signed and Sealed this

Fourth Day of March, 2003

JAMES E. ROGAN
*Director of the United States Patent and Trademark Office*